(12) United States Patent
Nakamura

(10) Patent No.: US 7,554,160 B2
(45) Date of Patent: Jun. 30, 2009

(54) SEMICONDUCTOR DEVICE

(75) Inventor: Kazutoshi Nakamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 442 days.

(21) Appl. No.: 11/333,281

(22) Filed: Jan. 18, 2006

(65) Prior Publication Data

US 2006/0186469 A1     Aug. 24, 2006

(30) Foreign Application Priority Data

Jan. 18, 2005     (JP) .............................. 2005-010637

(51) Int. Cl.
*H01L 23/62* (2006.01)

(52) U.S. Cl. ........................ 257/361; 257/355; 257/362; 257/E27.031; 257/E29.183

(58) Field of Classification Search ................. 257/355, 257/356, 358, 360–362, E27.031, 29.012, 257/E29.014, E29.183, E29.221 E, E29.221

See application file for complete search history.

(56) References Cited

U.S. PATENT DOCUMENTS

| | | | |
|---|---|---|---|
| 6,605,844 B2 | 8/2003 | Nakamura et al. | |
| 6,614,077 B2 | 9/2003 | Nakamura et al. | |
| 2002/0017697 A1* | 2/2002 | Kitamura et al. | ............ 257/492 |
| 2003/0197226 A1 | 10/2003 | Chen et al. | |

* cited by examiner

*Primary Examiner*—Matthew E Warren
(74) *Attorney, Agent, or Firm*—Oblon, Spivak, McClelland, Maier & Neustadt, P.C.

(57) ABSTRACT

A semiconductor device has a source region, a channel region and a drain region formed in order along a surface of a substrate, a vertical type bipolar transistor formed from the source region below the substrate, a base contact region of the vertical type bipolar transistor, a buried layer connected to the vertical type bipolar transistor, a buried contact layer which electrically conducts the drain region and the buried layer and a drift region formed between the drain region and the channel region, which has the same conductive type as that of the drain region and has impurity concentration less than that of the drain region.

5 Claims, 14 Drawing Sheets

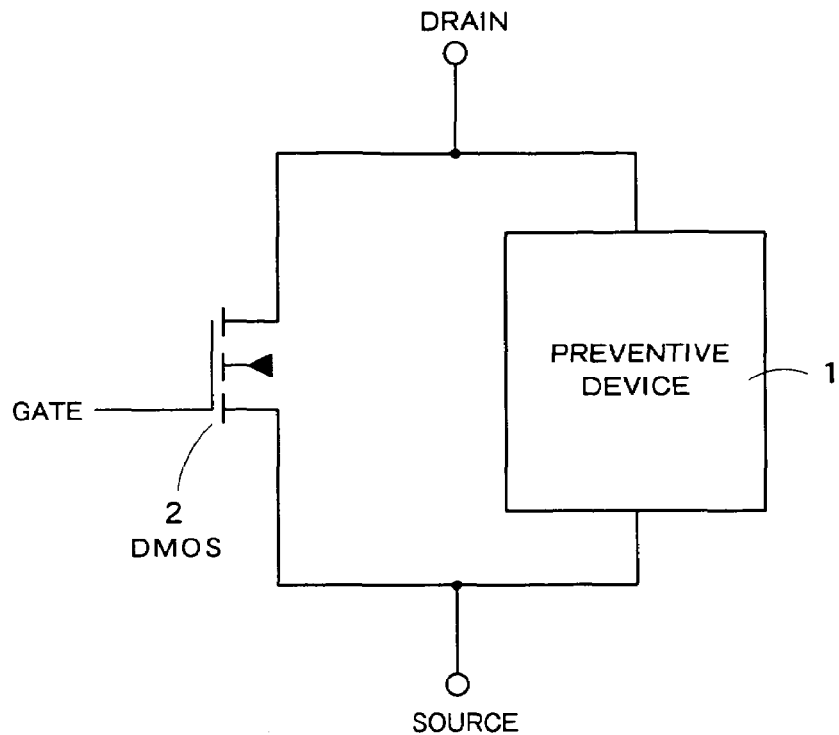
F I G. 2
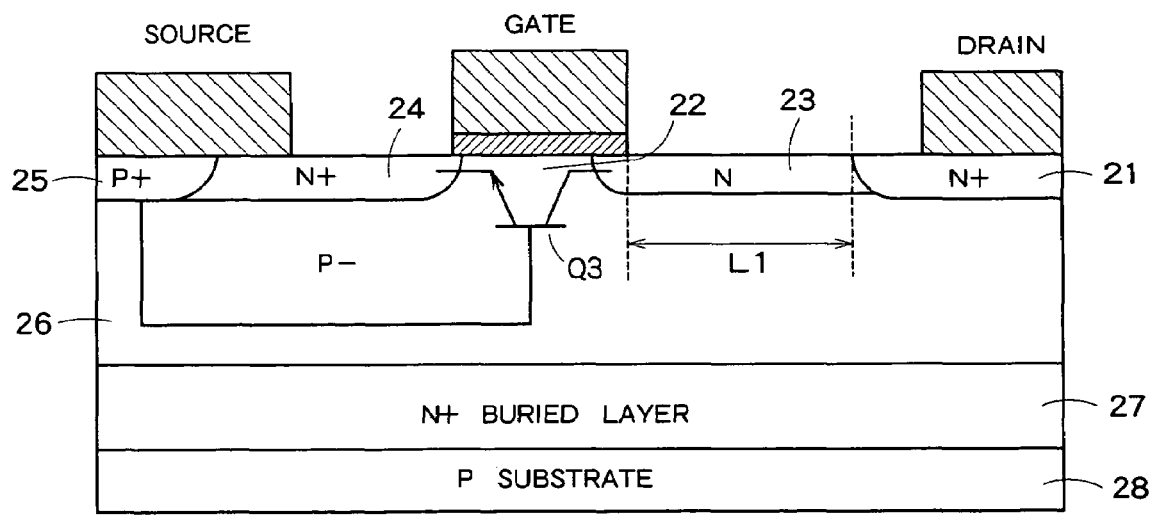
F I G. 3

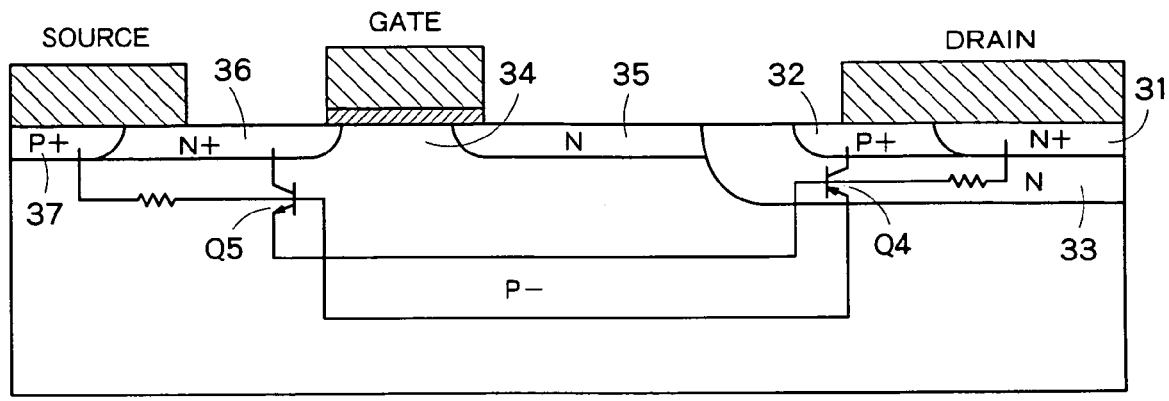
F I G. 4
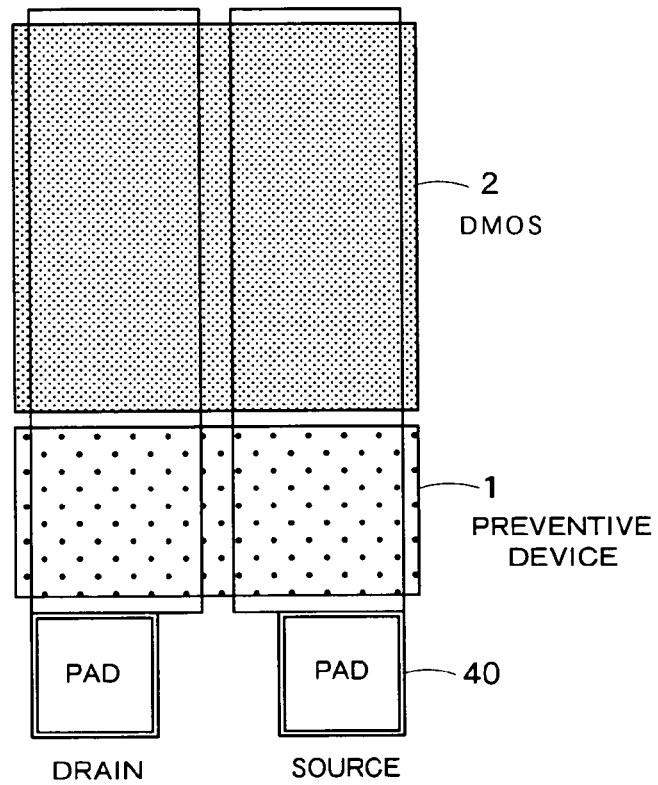
F I G. 5

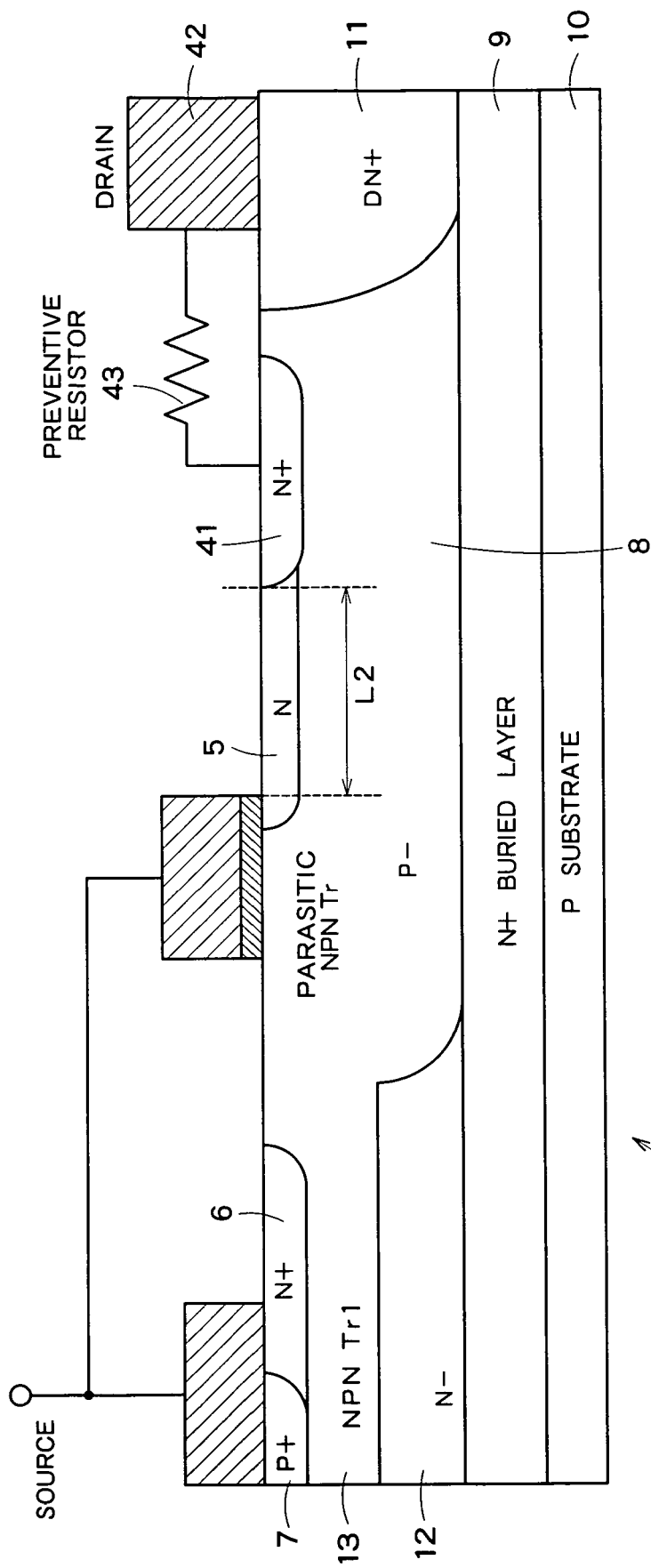
F I G. 6

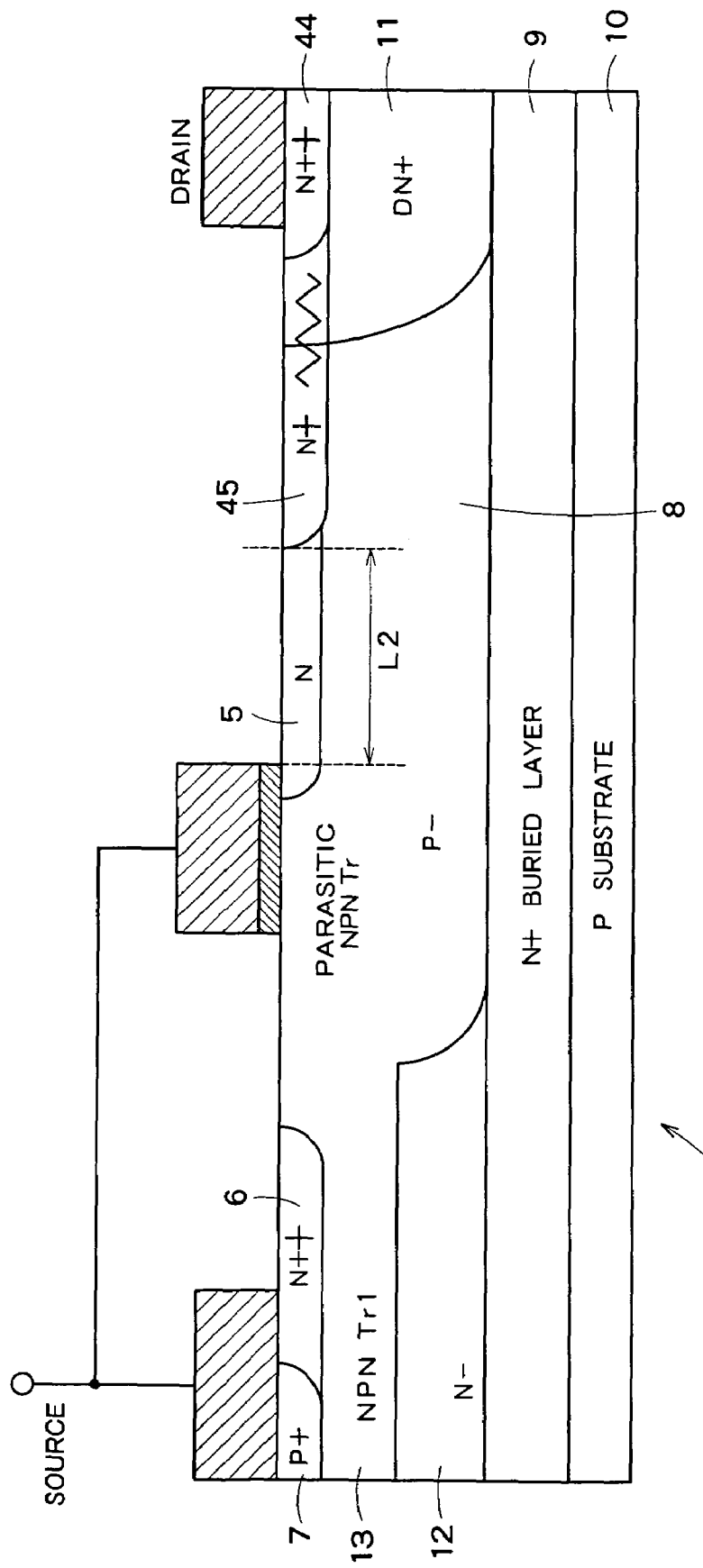
F I G. 7

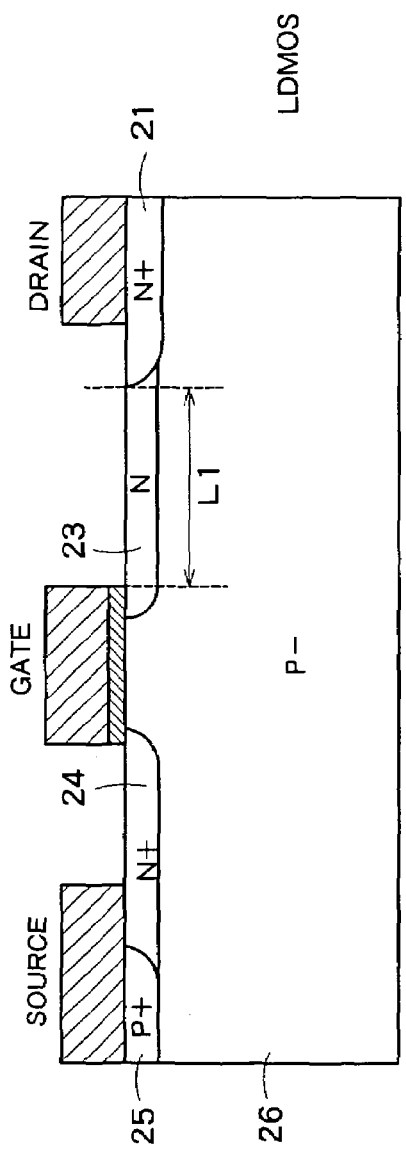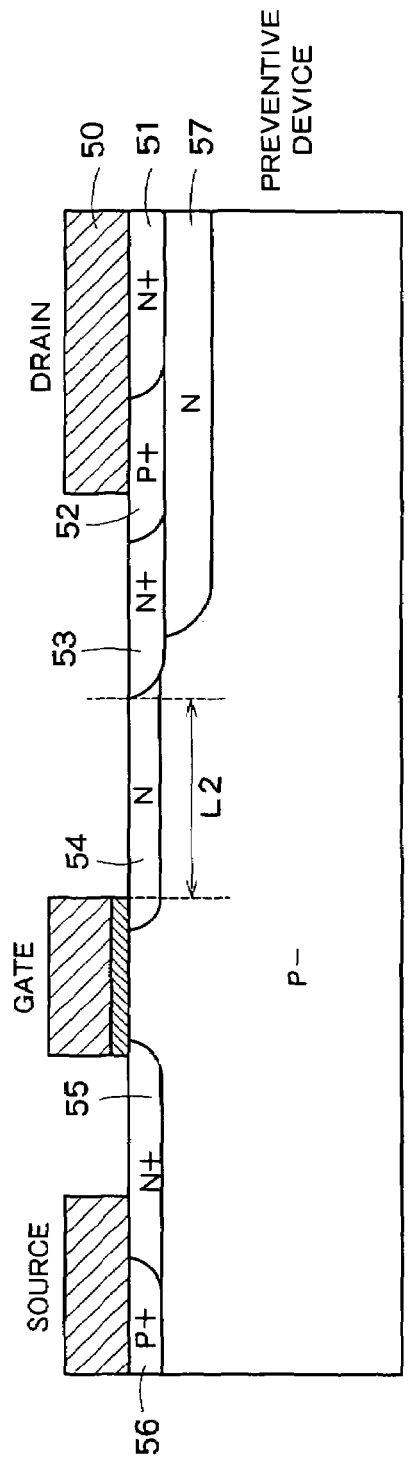
FIG. 8A
FIG. 8B

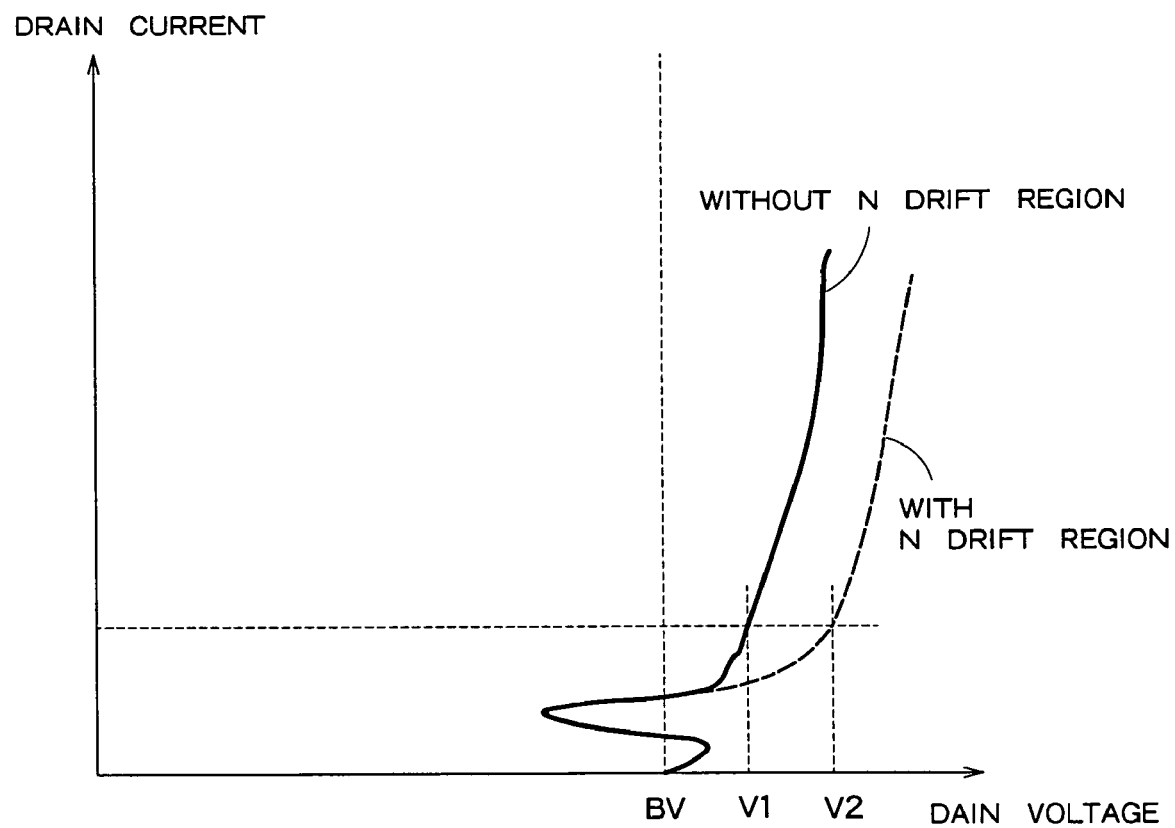
F I G. 12

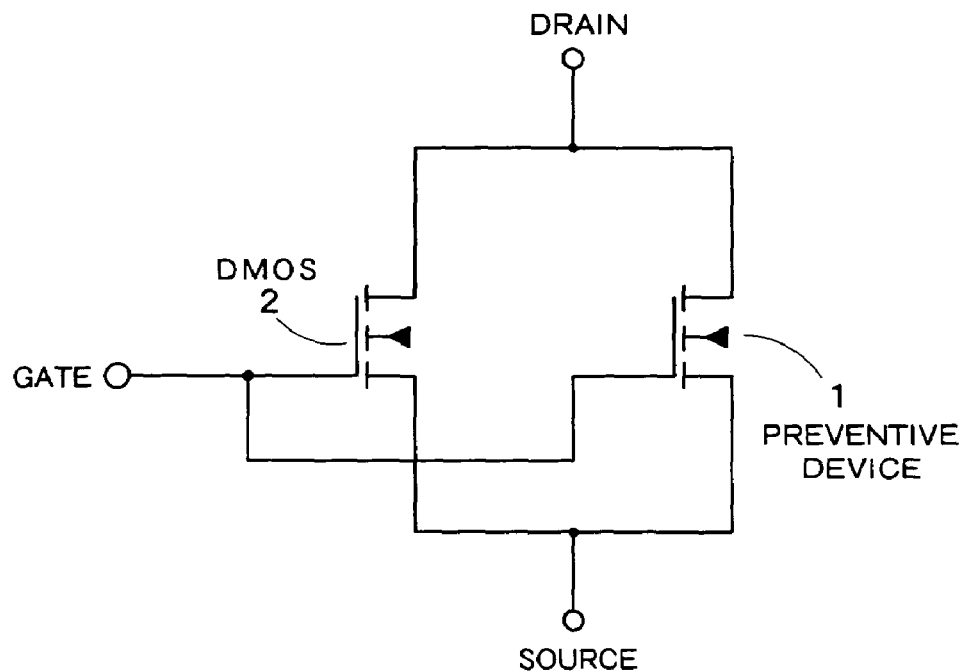
F I G. 16
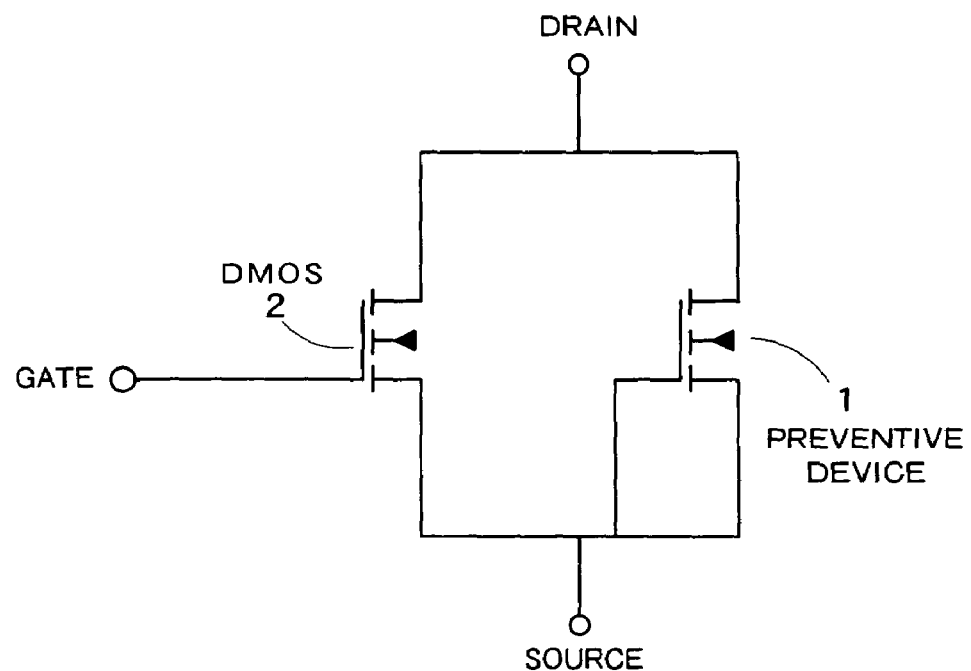
F I G. 17

SEMICONDUCTOR DEVICE

CROSS REFERENCE TO RELATED APPLICATIONS

This application is based upon and claims the benefit of priority from the prior Japanese Patent Application No. 2005-10637, filed on Jan. 18, 2005, the entire contents of which are incorporated herein by reference.

BACKGROUND OF THE INVENTION

1. Field of the Invention

The present invention relates to a semiconductor device having a high breakdown voltage structure.

2. Related Art

Generally, power ICs are classified by both of a low voltage and a high breakdown voltage device, and widely used, for example, in an automotive industry. Environment for an automotive semiconductor device is severe. Therefore, protection at relatively higher level is required with respect to Electrostatic discharge (ESD) or other kinds of electrical transient phenomena. ESD is considered as a high energy pulse produced when a person or an object bearing electric charges touches an IC.

As a method of protecting the semiconductor device from ESD, it is considered that a resistance element is inserted between a semiconductor device and an output pin to limit a current accompanied with Electrostatic discharge. However, for LDMOS, a high breakdown voltage device, a low on-resistance and a high breakdown voltage are required. Therefore, it is not good to insert a resistance element, because the on-resistance property of LDMOS seen from a pad will be suffered.

As for the conventional LDMOS, when Electrostatic discharge occurs, a strong electric field is applied to a drain edge, and avalanche breakdown occurs, resulting in production of electrons and holes. Hole current flows through a base of a parasitic bipolar transistor in LDMOS to activate a parasitic bipolar transistor. As for its collector current, there is a problem that a local current concentration occurs at the drain edge, and thermal runaway occurs in the region, thereby, enough ESD immunity cannot be obtained. In addition, even if the parasitic bipolar remained inactivated, a high avalanche current locally increases the intensity of the electric field at the drain edge, thereby a thermal runaway also occurs at the drain edge (see; Japanese Patent Laid-Open No. 2001-352070).

SUMMARY OF THE INVENTION

According to one embodiment of the present invention, a semiconductor device has a source region, a channel region and a drain region formed in order along a surface of a substrate;

a vertical type bipolar transistor formed from the source region below the substrate;

a base contact region of the vertical type bipolar transistor;

a buried layer connected to the vertical type bipolar transistor;

a buried contact layer which electrically conducts the drain region and the buried layer; and a drift region formed between the drain region and the channel region, which has the same conductive type as that of the drain region and has impurity concentration less than that of the drain region.

Furthermore, according to one embodiment of the present invention, a semiconductor device, comprising:

first and second switching elements connected in parallel to each other, wherein the first switching element includes:

a first source region, a first channel region and a first drain region formed in order along a surface of a substrate;

a first base contact region formed adjacent to the first source region; and a first drift region formed between the first drain region and the first channel region, which has the same conductive type as that of the first drain region and has impurity concentration less than that of the first drain region, the second switching element includes:

a second source region, a second channel region and a second drain region formed in order along a surface of a substrate;

a vertical bipolar transistor formed from the second source region below the substrate;

a second base contact region of the vertical bipolar transistor;

a buried layer connected to the vertical bipolar transistor;

a buried contact layer which electrically conducts the second drain region and the buried layer; and a second drift layer formed between the second drain region and the second channel region, which has the same conductive type as that of the second drain region and has impurity concentration less than that of the second drain region.

Furthermore, according to one embodiment of the present invention, a semiconductor device, comprising:

first and second switching elements connected in parallel to each other, wherein the first switching element includes:

a first source region, a first channel region and a first drain region formed in order along a surface of a substrate;

a first base contact region formed adjacent to the first source region; and a first drift region formed between the first drain region and the first channel region, which has the same conductive type as that of the first drain region and has impurity concentration less than that of the first drain region, the second switching element includes:

a second source region, a second channel region and a second drain region formed in order along a surface of a substrate;

a second base contact region formed adjacent to the second source region;

a hole injection preventive region having a conductive type different from that of the second drain region, a second drift region formed of the same material as that of the first drain region, and a third drift region, each being formed in order adjacent between the second drain region and the second channel region; and a base layer which is formed on under surfaces of the second drain region, the hole injection preventive region and the second drift region and is formed so that the second drift region protrudes to a side nearer to a gate side.

BRIEF DESCRIPTION OF THE DRAWINGS

FIG. 2 is a schematic circuit diagram in the case where the semiconductor device of FIG. 1 is used as the protective device.

FIG. 3 is a view showing one example of the sectional structure of LDMOS 2 in FIG. 2.

FIG. 4 is a view showing a sectional structure of a comparative example of the protective device 1 in FIG. 1.

FIG. 5 is a view showing an example of layout arrangements of the protective device 1 and LDMOS 2.

FIG. 6 is a view showing the sectional structure of a semiconductor device according to the second embodiment of the present invention.

FIG. 7 is a sectional view showing a specific example of the semiconductor device (protective device 1) of FIG. 6.

FIGS. 8A and 8B are a view showing a sectional structure of a semiconductor device according to a third embodiment of the present invention.

FIG. 12 is a view showing the relationships between drain voltage and drain current in cases of having and not having the N drift region 23d.

FIG. 16 is a view in which gates of the LDMOS and the protective device are connected commonly.

FIG. 17 is a view showing an example in which the gate and the source of the protective device are shortcut.

DETAILED DESCRIPTION OF THE INVENTION

Figure 1:
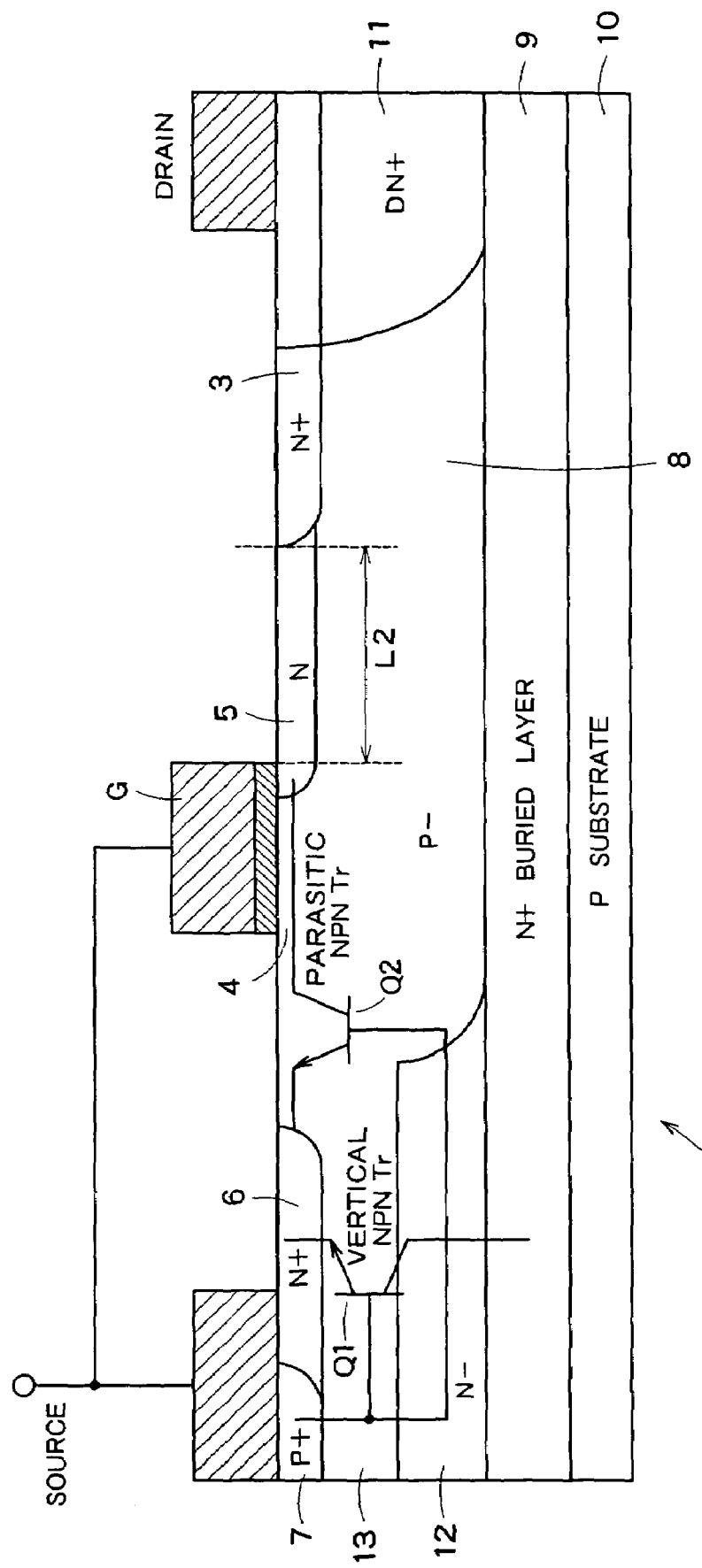
FIG. 1 is a view showing a sectional structure of a semiconductor device according to a first embodiment of the present invention.

Now referring to the drawings, one embodiment of the present invention will be described below.

FIRST EMBODIMENT

FIG. 1 is a view showing a sectional structure of a semiconductor device according to a first embodiment of the present invention. The semiconductor device of FIG. 1 is mainly used as a protective device for inhibiting Electrostatic discharge (ESD) destruction. FIG. 2 is a schematic circuit diagram in the case where the semiconductor device of FIG. 1 is used as the protective device. As shown in FIG. 2, a protective device 1 is connected in parallel to a high breakdown voltage device 2. A high breakdown voltage device 2 is, for example, a Lateral Double Diffusion MOS (LDMOS).

When Electrostatic discharge occurs in the circuit of FIG. 2, a high voltage is applied between a source and a drain. However, LDMOS 2 can be protected by flowing the current due to the high voltage into the protective device 1.

First, using FIG. 1, a structure of the protective device 1 will be described. The protective device 1 has a structure in which a vertical bipolar transistor Q1 and a parasitic bipolar transistor Q2 are formed in parts of a device having a MOS structure. An N drift region 5 is formed between an N$^+$ drain region 3 and a channel region 4 directly underneath the gate. A P$^+$ base contact region 7 is formed adjacent to an N$^+$ source region 6. Here, the N$^+$ source region 6 and the P$^+$ base contact region 7 are formed adjacently to each other, however, they are not necessarily adjacent to each other.

The N$^+$ drain region 3, N drift region 5, N$^+$ source region 6, and P$^+$ base contact region 7, are formed within a P$^-$ active layer 8, respectively. An N$^+$ buried layer 9 is formed on a lower surface of the P$^-$ semiconductor region 8, and a P substrate 10 is formed on a lower surface of the N$^+$ buried layer 9. It is desirable that the dose concentration and the impurity concentration of the N drift region 5 are set to $2\times10^{12}$ to $4\times10^{12}$ cm$^{-2}$, and to $3\times10^{16}$ to $5\times10^{17}$ cm$^{-3}$, respectively. The N$^+$ drain region 3 and the N$^+$ buried layer 9 are electrically conducted through a DN$^+$ buried contact region 11.

An N$^-$ active region 12 is formed on an upper surface of the N$^+$ buried layer 9 in which a vertical bipolar transistor Q1 (hereinafter, referred to as a vertical transistor) is formed. A P base region 13 (a narrower width region of the P$^-$ active layer 8) between the N$^-$ active region 12, and the N$^+$ source region 6 and the P$^+$ base contact region 7 above the layer 12, becomes a base region of the vertical transistor Q1. An emitter of the transistor Q1 is the N$^+$ source region 6, and a collector is the N$^+$ buried layer 9. In this manner, the vertical transistor Q1 is an NPN transistor.

A base of the parasitic bipolar transistor (hereinafter, referred to as a parasitic transistor) Q2 is a region from the P$^+$ base contact region 7 to the P$^-$ active layer 8 via N$^-$ active region 12, an emitter is the N$^+$ source region 6, and a collector is the N drift region 5. The h$_{FE}$ (current gain) of the transistor Q1 is larger than that of the transistor Q2.

Next, operations of the protection element 1 in FIG. 1 will be described. When Electrostatic discharge occurs, a high voltage is applied between the drain and the source. At that time, avalanche breakdown occurs at the gate side (near the boundary between the N$^+$ drain region 3 and the N drift region 5) of the N$^+$ drain region 3. Holes produced in the avalanche breakdown flows into the P$^+$ base contact region 7 through the P$^-$ active layer 8. This turns on the vertical transistor Q1 consisted of the N$^+$ source region 6, the P base region 13, and the N$^+$ buried layer 9.

Current concentration can be more mitigated by turning the vertical transistor Q1 on, than turning on the parasitic transistor Q2 consisted of the P$^-$ active layer 8 and the N$^+$ drain region 3.

FIG. 3 is a view showing one example of the sectional structure of LDMOS 2 in FIG. 2. The LDMOS 2 of FIG. 3 has a structure in which a parasitic bipolar transistor Q3 is formed in a MOS structure. An N drift region 23 is formed between an N$^+$ drain region 21 and a channel region 22 of the gate. A P$^+$ base contact region 25 is formed adjacent to an N$^+$ source region 24. The N$^+$ drain region 21, N drift region 23, N$^+$ source region 24, and P$^+$ base contact region 25, are formed within parts of a P$^-$ active layer 26, an N$^+$ buried layer 27 is formed on the lower surface of the P$^-$ active layer 26, and a P substrate 28 is formed on the lower surface of the N$^+$ buried layer 27. It is desirable that the dose concentration and the impurity concentration of the N drift region 23 are set to $2\times10^{12}$ to $4\times10^{12}$ cm$^{-2}$, and to $3\times10^{16}$ to $5\times10^{17}$ cm$^{-3}$, respectively.

The base of the parasitic bipolar transistor (hereinafter, referred to as a parasitic transistor Q3) is the P$^+$ base contact region 25 and the P$^-$ active layer 26, the emitter is the N$^+$ source region 24, and the drain is the N drift region 23. In this manner, the parasitic transistor Q3 is an NPN transistor. The parasitic transistor Q3 turns on when Electrostatic discharge occurs.

More particularly, when Electrostatic discharge occurs, a strong electric field is applied to the base side edge of the N$^+$ drain region 21, and avalanche breakdown occurs to produce electrons and holes. Hole current flows into a P well layer to turn on the parasitic transistor Q3, and the N+ drain region 21 is clumped in a low voltage state. However, local current concentration occurs at the side edge of the base of the N+ drain region 21.

Therefore, the embodiment is intended to surely operate a protective device 1 during Electrostatic discharge by decreasing the breakdown voltage of the protective device 1 lower than that of LDMOS 2. As can be understood from FIG. 1 and 3, the lateral lengths of N+ drain regions 3 and 21 are different, however, the drain side structure of LDMOS 2 is identical to that of the protective device 1. Here, if the lateral length L1 of the N drift region 23 of LDMOS 2 is made longer than the lateral length L2 of the N drift region 5 of the protective device 1, it is possible to operate the protective device 1 earlier than LDMOS 2 during Electrostatic discharge.

FIG. 4 is a view showing a sectional structure of a comparative example of the protective device 1 in FIG. 1. While in the first embodiment, ESD immunity is improved by changing the structure at the source side of LDMOS of FIG. 3, in the embodiment of FIG. 4, ESD immunity is improved by changing the structure at the drain side. The protective device 1 of FIG. 4 differs from that of FIG. 1 with respect to the structure at the drain side. The protective device 1 of FIG. 4 has a P+ anode region 32 for protecting holes from being implanted, which is adjacent to the N+ drain region 31. An N base region 33 is formed below these regions so as to cover the N+ drain region 31 and the P+ anode region 32. An N drift region 35 is formed between the N base region 33 and the channel region 34. The source side structure is identical to that of FIG. 1, and has an N+ drain region 36 and a P+ base contact region 37 adjacent each other.

The protective device 1 of FIG. 4 has a parasitic PNP transistor Q4 formed at the drain side and a parasitic NPN transistor Q5 formed at the source side. The collector of the parasitic PNP transistor Q4 is the P+ anode region 32, and the collector region of the parasitic NPN transistor Q5 is the N+ source region 36. The base of the parasitic PNP transistor Q4 is connected to the emitter of the parasitic NPN transistor Q5, and the emitter of the parasitic PNP transistor Q4 is connected to the base of the parasitic NPN transistor Q5.

In the protective element 1 of FIG. 4, when Electrostatic discharge occurs, either one of the parasitic NPN transistors Q5 or the parasitic PNP transistor Q4 is turned on first, and the other is turned on next. In this manner, it is intended to absorb a high voltage produced due to Electrostatic discharge, by performing thyristor operation to attain a low on-resistance between the source and the drain without local current concentration.

However, in the case of the protective device 1 of FIG. 4, once the operation is started to turn on the parasitic NPN transistor Q5 and the parasitic PNP transistor Q4, there is a problem that they cannot be turned off. Therefore, if LDMOS 2 is connected in parallel to the protective device 1 of FIG. 4, even when LDMOS 2 is turned off during usual operation, the protective device 1 may continue to be turned on.

On the contrary, since the protective device 1 of FIG. 1 has no P+ anode region at the drain side, the parasitic PNP transistor Q4 similar to that of FIG. 4 also does not exist, thereby there is no possibility for the protective device 1 to be turned on during ordinary operation.

FIG. 5 is a view showing an example of layout arrangements of the protective device 1 and LDMOS 2. In the example of FIG. 5, the protective device 1 is arranged nearer to a pad 40, compared with LDMOS 2.

This enables that a high voltage due to Electrostatic discharge is applied to the protective device 1 such that a current due to Electrostatic discharge flows into the protective device 1 by priority.

In this manner, in the first embodiment, current concentration at the base side edge of the N+ drain region 3 can be mitigated, because, by forming the vertical transistor Q1 at the source side, the hole current produced during Electrostatic discharge flows into the vertical transistor Q1. In addition, a high voltage is not applied, because, during Electrostatic discharge, by making the lateral length L1 of the N drift region 23 of LDMOS 2 longer than the lateral length L2 of the N drift region 5 of the protective device 1, the protective device 1 can be operated at faster timing than LDMOS 2. Further, at the drain side of the protective device 1, there is no P+ anode region. This causes the parasitic PNP transistor impossible to be formed, and when avalanche current cannot be supplied, the NPN transistor becomes inactive, thereby, it is possible to surely prevent the protective device 1 from continuing to operate even during usual operation.

SECOND EMBODIMENT

A second embodiment is intended to provide a high resistance region between an N drift region and an N+ drain region.

When Electrostatic discharge occurs, electric field concentration may occur at the base side edge of the N+ drain region to flow a large current, however, if a high resistance region is formed at the base side edge, the current can be inhibited.

FIG. 6 is a view showing the sectional structure of a semiconductor device according to the second embodiment of the present invention, and the structure of a protective device 1 is shown. In FIG. 6, the common components with FIG. 1 are denoted by the same reference numerals, and the different points will be mainly described below.

The semiconductor device of FIG. 6 has an N+ drain region 41 formed separately to a DN+ contact region 11 contacting with a drain electrode 42, and a high resistance region 43 formed between the N+ drain region 41 and the drain electrode 42.

In FIG. 6, the high resistance region is shown schematically, however, a form and a shape of the high resistance region are not especially limited. It may be formed by forming a resistive element layer on the surface of a substrate, or by implanting impurity ions into the substrate to form a high resistance diffusion layer.

FIG. 7 is a sectional view showing a specific example of the semiconductor device (protective device 1) of FIG. 6. The protective device 1 of FIG. 7 has a first N++ drain region 44 arranged directly underneath a drain electrode, a second N+ drain region 45 arranged adjacent to the first N++ drain region 44, and an N drift region 5 arranged adjacent to the second N+ drain region 45.

The second N+ drain region 45 is a high resistance region formed by implanting As or P ions.

In this manner, a current flowing into a laterally formed parasitic transistor during Electrostatic discharge, can be inhibited by forming a high resistance region such as in FIG. 6 or FIG. 7 at the drain side, thereby, most of the current can be flowed into the vertical transistor Q1.

THIRD EMBODIMENT

As mentioned above, in a circuit in which LDMOS 2 and a protective device 1 are connected in parallel, during Electrostatic discharge, in order to operate the protective device 1 at faster timing than LDMOS 2, it is required that the breakdown voltage of the protective device 1 is set lower than that of LDMOS 2. For this purpose, it is desirable to adjust the lateral length of the N drift region at the drain side in each of the protective device 1 and LDMOS 2.

FIG. 8 is a view showing a sectional structure of a semiconductor device according to a third embodiment of the present invention. FIG. 8A shows a sectional structure of LDMOS 2, and FIG. 8B shows a sectional structure of the protective device 1. The structure of FIG. 8A is identical to that of FIG. 3, thereby, the description of the structure will be omitted. The protective device 1 of FIG. 8B has a feature in its drain side structure. A $P^+$ anode region 52, a first $N^+$ drift region 53, and a second $N^+$ drift region 54 are formed in order adjacently and laterally to a first $N^+$ drain region 51 arranged directly underneath a drain electrode 50. The source side structure is similar to that of FIG. 1, and has an $N^+$ source region 55 and a $P^+$ base contact region 56 adjacent to each other.

An N base region 57 is formed on the lower surfaces of the first $N^+$ drain region 51, $P^+$ anode region 52, and the first $N^+$ drift region 53. The first $N^+$ drift region 53 is formed such that it protrudes nearer to the base side than the N base region 57.

The $N^+$ drain region 21 of LDMOS 2 and the first $N^+$ drift region 53 of the protective device 1 are diffusion layers which are formed using the same material and manufacturing step.

In the protective device 1 having the structure of FIG. 4, a breakdown voltage is determined by a length between the N base region 33 and the gate electrode. On the other hand, in the protective device 1 having the structure of FIG. 8B, the breakdown voltage is determined by the length between the first $N^+$ drift region 53 and the gate electrode, because the first $N^+$ drift region 53 protrudes larger than the N base region 57. In addition, in LDMOS 2 of FIG. 8A, the breakdown voltage is determined by a length between an $N^+$ drain region 21 and the gate electrode.

In this manner, as for LDMOS 2 of FIG. 8A and the protective device 1 of FIG. 8B, the parameters determining their breakdown voltages are identical, and the $N^+$ drain region 21 and the first $N^+$ drift region 53 are formed with the same step and the same material, thereby, the variation of their processes also indicate identical tendency. Therefore, it is not necessary to consider a process margin at a stage of manufacturing the protective device 1.

More particularly, if the lateral length L1 of the N drift region 23 of LDMOS 2 is made longer than the lateral length L2 of the second N drift region 54 of the protective device 1, a high voltage produced by Electrostatic discharge can be surely absorbed with the protective device 1, enabling to reduce the on-resistance of LDMOS 2.

In this manner, in the third embodiment, since the parameters to determine the breakdown voltages for LDMOS 2 and the protective device 1 are identical, it becomes unnecessarily to consider the process margin, thereby, by making the lateral length L1 of the N drift region of LDMOS 2 longer than the lateral length L2 of the second N drift region of the protective device 1, it is possible to surely operate the protective device 1 during Electrostatic discharge.

FOURTH EMBODIMENT

A fourth embodiment is intended to provide two drift layers arranged adjacent to LDMOS 2.

Figure 9A:
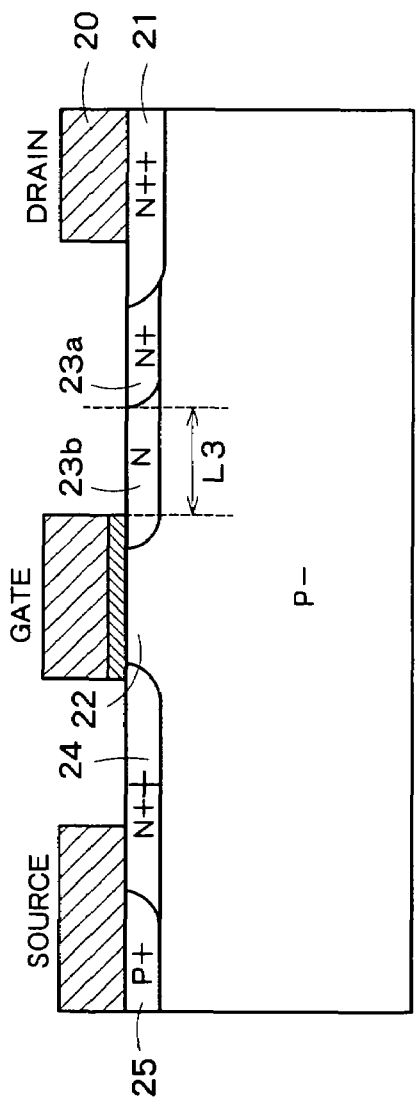
FIGS. 9A and 9B are a view showing a sectional structure of a semiconductor device according to the fourth embodiment of the present invention.
Figure 9B:
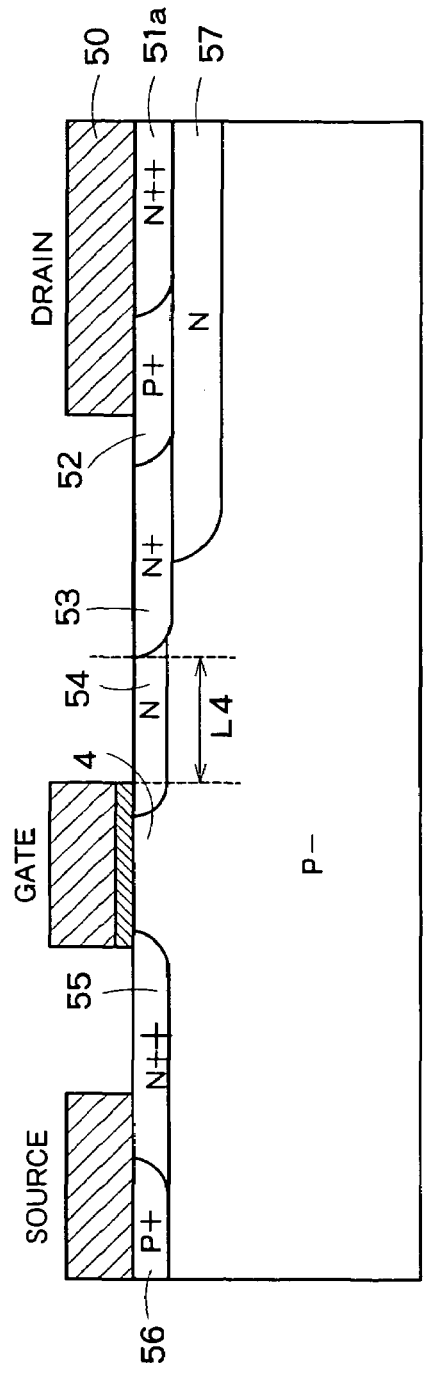

FIG. 9 is a view showing a sectional structure of a semiconductor device according to the fourth embodiment of the present invention. FIGS. 9A and 9B show sectional structures of LDMOS 2 and the protective device 1, respectively.

LDMOS 2 shown in FIG. 9A has an $N^{++}$ drain region 21 arranged directly underneath a drain electrode 20, a first $N^+$ drift region 23a formed adjacent to the $N^{++}$ drain region 21, and a second N drift region 23b formed between the first $N^+$ drift region 23a and a channel region 22.

The protective device 1 shown in FIG. 9B has an $N^{++}$ drain region 51a arranged directly underneath a drain electrode 50, a $P^+$ anode region 52 formed adjacent to the $N^{++}$ drain region 51a, a first $N^+$ drift region 53 formed adjacent to the $P^+$ anode region 52, and a second N drift region 54 formed between the first $N^+$ drift region 53 and a channel region 4. An N base region 57 is formed on the lower surfaces of the $N^{++}$ drain region 51a, the $P^+$ anode region 52, and the first $N^+$ drift region 53. The first $N^+$ drift region 53 protrudes nearer to the gate side than the N base region 57.

The second N drift regions 23b, 54 of LDMOS 2 and the protective device 1, act as an electric field relaxation layer, and of which impurity concentrations are set lower than those of the first $N^+$ drift regions 23a, 53. Since the first $N^+$ drift region 53 of the protective device 1 protrudes to the gate side nearer than the N base region 57, breakdown voltages of both LDMOS 2 and the protective device 1 are determined by the lengths of the second N drift regions 23b, 54. More particularly, the lateral length L3 of the second N drift region 23b of LDMOS 2 is made longer than the lateral length L4 of the second N drift region 54 of the protective device 1

The breakdown voltage of the first $N^+$ drift regions 23a during ON state, can be improved by setting the impurity concentration of the first N drift region 23a to a value between that of the second N drift region 23b and that of $N^{++}$ drain region 21.

In this manner, in the forth embodiment, as for LDMOS 2 and the protective device 1, the parameters determining their breakdown voltages are also identical, thereby, by adjusting the lateral lengths of the second N drift regions 23b, 54, it is possible to surely operate the protective device 1 during Electrostatic discharge.

FIFTH EMBODIMENT

A fifth embodiment is a modified example of the second embodiment.

Figure 10:
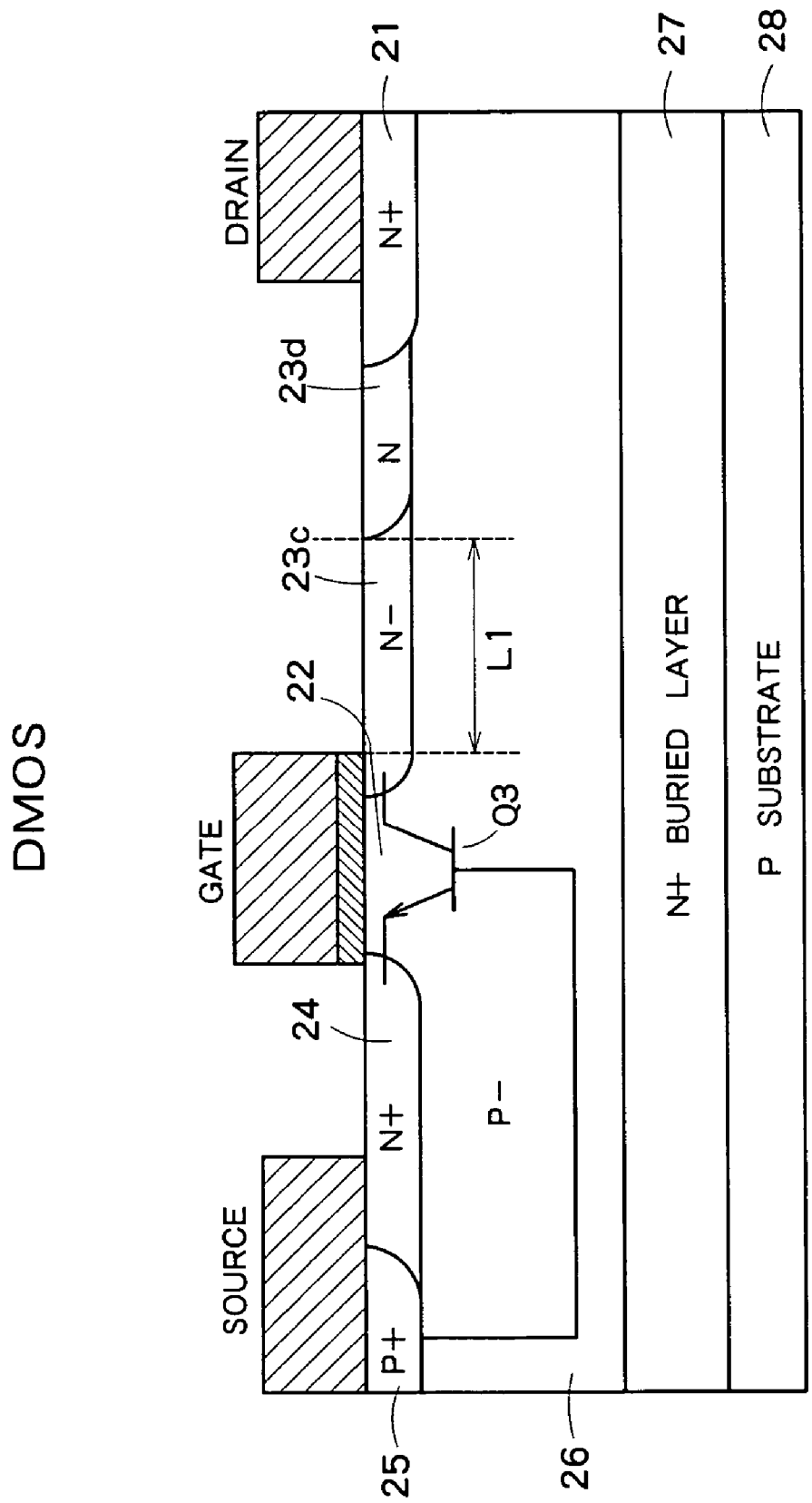
FIG. 10 is a view showing the sectional structure of a semiconductor device according to the fifth embodiment of the present invention.

FIG. 10 is a view showing the sectional structure of a semiconductor device according to the fifth embodiment of the present invention, and the sectional structure of LDMOS 2 is shown. In LDMOS 2 of FIG. 10, an $N^-$ drift region 23c and an N drift region 23d are formed adjacent to the region between an $N^+$ drain region 21 and a channel region 22 of the gate. The N drift region 23d acts so as to improve the breakdown voltage during being on.

Figure 11:
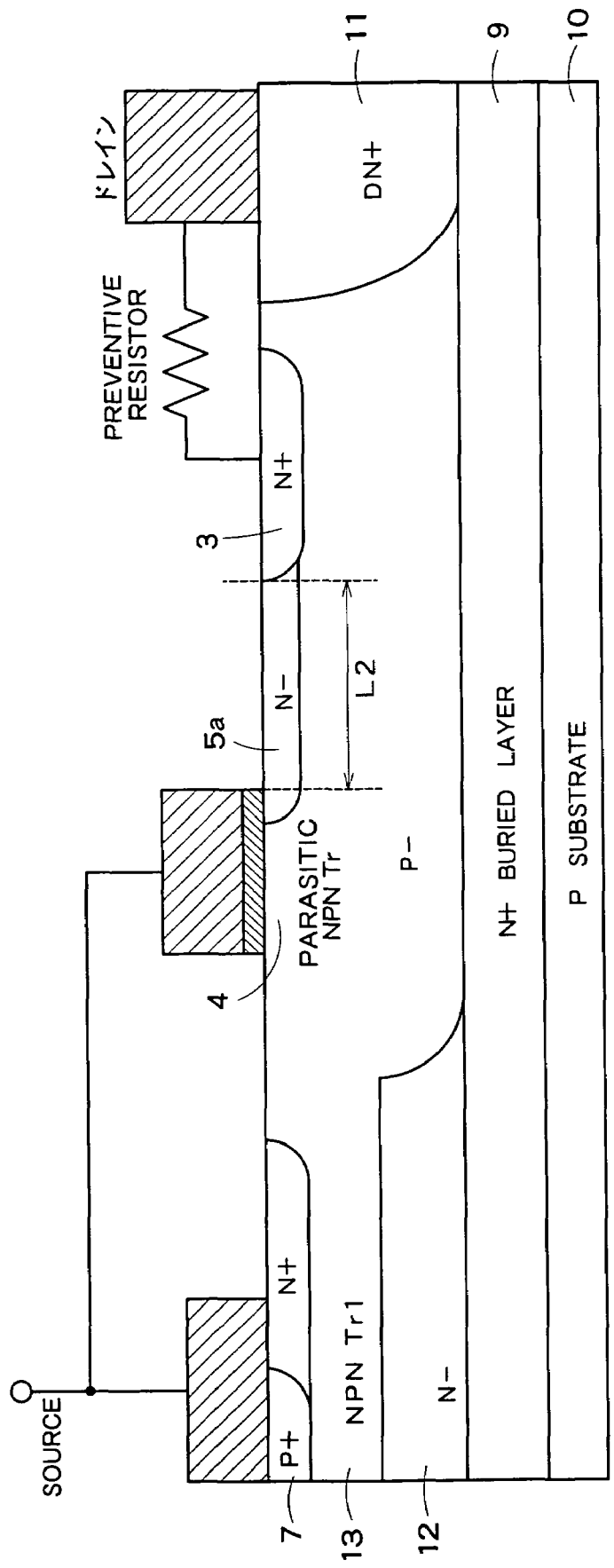
FIG. 11 is a view showing a sectional structure of a protective device 1 connected in parallel to LDMOS 2 of FIG. 10.

FIG. 11 is a view showing a sectional structure of a protective device 1 connected in parallel to LDMOS 2 of FIG. 10. The protective device 1 of FIG. 11 does not include an N drift region 23d such as in FIG. 10, and includes an $N^-$ drift region 5a which contacts to a channel region 22, and an $N^+$ drain region 3 arranged adjacent to the $N^-$ drift region 5a.

The reason why the protective device 1 of FIG. 11 does not include the N drift region 23d such as in FIG. 10, will be described below. FIG. 12 is a view showing the relationships between drain voltage and drain current in cases of having and not having the N drift region 23d.

If a startup voltages of the drain currents in cases of having and not having the N drift region 23d are denoted by V1 and V2, respectively, the relation, V2>V1, is hold. Thus, in the case of the presence of the N drift region 23d, the startup voltage of the drain current becomes higher than that of the case of the absence of the N drift region 23d. This is because when a high current flows, the electric field at the drain edge is relaxed by the N drift region 23d, thereby, an avalanche current to be the base current is reduced, resulting difficult to operate the NPN transistor Q2.

In addition, when electrostatic breakdown voltage is denoted by BV, in the case of the presence of the N drift region 23d, the difference between the startup voltage and the electrostatic breakdown voltage BV becomes larger. Therefore, in the case of the presence of the N drift region 23d, during setting the breakdown voltage of LDMOS 2 of FIG. 10, it is required to set the value higher by (V2-V1). By setting the breakdown voltage to a higher value, the on-resistance increases, thereby, it is desirable to make the difference between the startup voltage and BV as small as possible. For the reasons stated above, the protective device 1 is not provided with the N drift region 23d.

It is desirable that the dose concentration and the impurity concentration of the N⁻ drift region 23c are set to $2\times10^{12}$ to $4\times10^{12}$ cm$^{-2}$, and to $3\times10^{16}$ to $5\times10^{17}$ cm$^{-3}$, respectively. It is desirable that the dose concentration and the impurity concentration of the N⁻ drift region b are set to $4\times10^{12}$ to $8\times10^{12}$ cm$^{-2}$, and to $6\times10^{16}$ to $1\times10^{18}$ cm$^{-3}$, respectively.

SIXTH EMBODIMENT

A sixth embodiment is a modified example of FIGS. 1 and 6.

Figure 13:
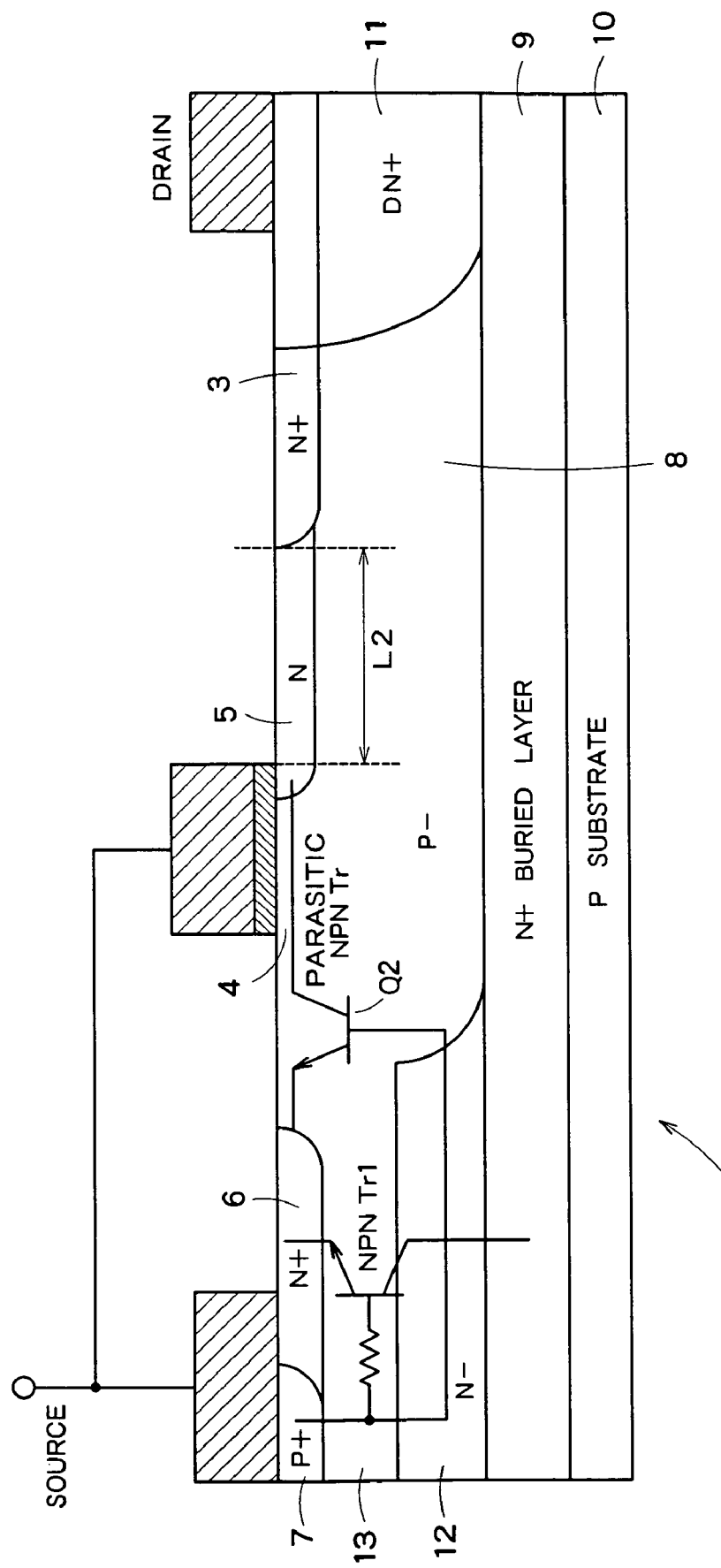
FIG. 13 is a view showing a sectional structure of a semiconductor device according to the sixth embodiment of the present invention.

FIG. 13 is a view showing a sectional structure of a semiconductor device according to the sixth embodiment of the present invention. The semiconductor device of FIG. 13 has the structure of adding a resistor R2 in the semiconductor device of FIG. 1. The resistor R2 is a base resistor formed of a P base layer of the transistor Q1, and is connected between the N⁺ source region 6 and the P⁺ base contact region 7.

In FIG. 13, a value of the resistor R2 has to be controlled to control the base current of the transistor Q1 by the protective device 1. However, the value of the resistor R2 depends on the resistance of the resistor R2, and it is difficult to control the resistance of the resistor R2.

Figure 14:
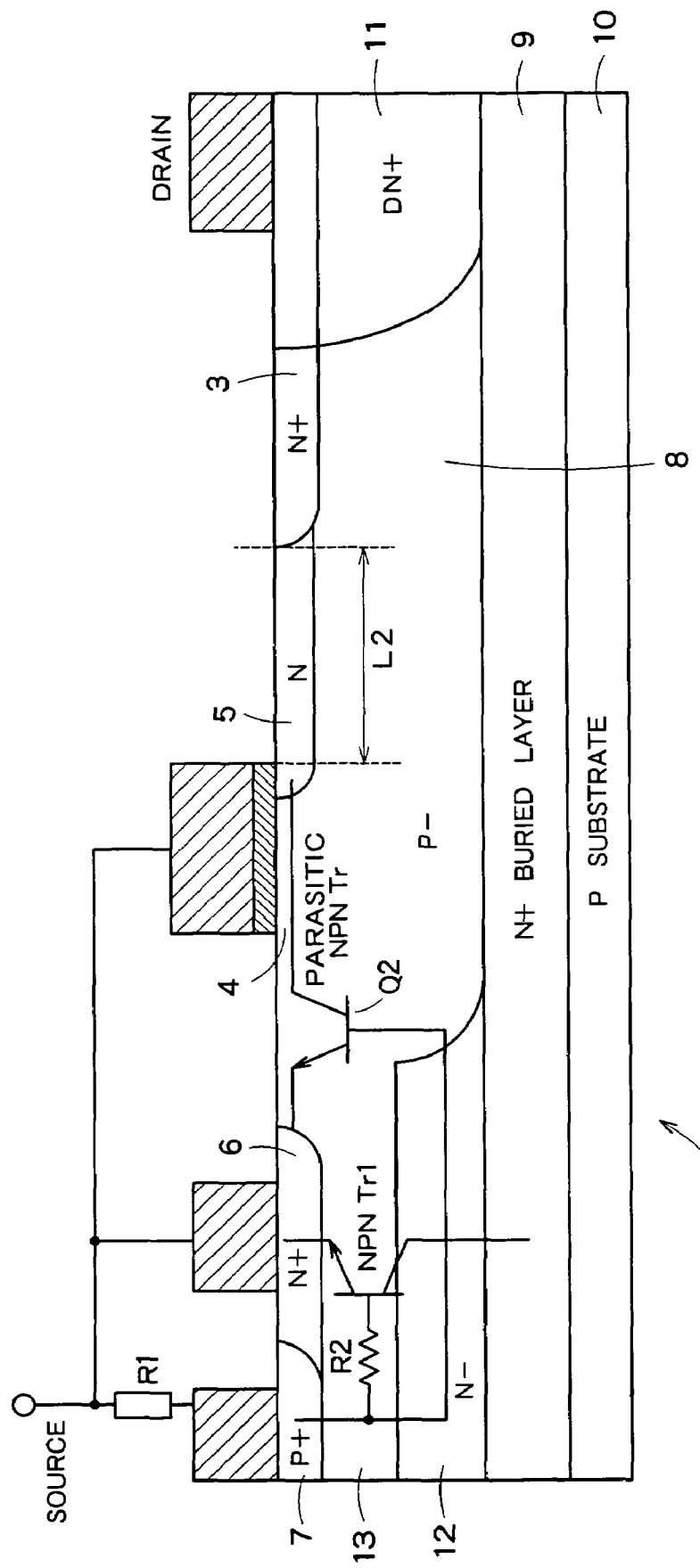
FIG. 14 is a view showing a sectional structure of a semiconductor device which can solve the above problem.

FIG. 14 is a view showing a sectional structure of a semiconductor device which can solve the above problem. The semiconductor device of FIG. 14 has a resistor R3 connected to the source of the semiconductor device it becomes easy to control the base current activated by the protective device 1 by controlling the resistance of the resistor R3. The resistor R3 can be formed of a poly-silicon resistor, a diffusion resistor or the like.

THE OTHER EMBODIMENT

Figures 15A, 15B:
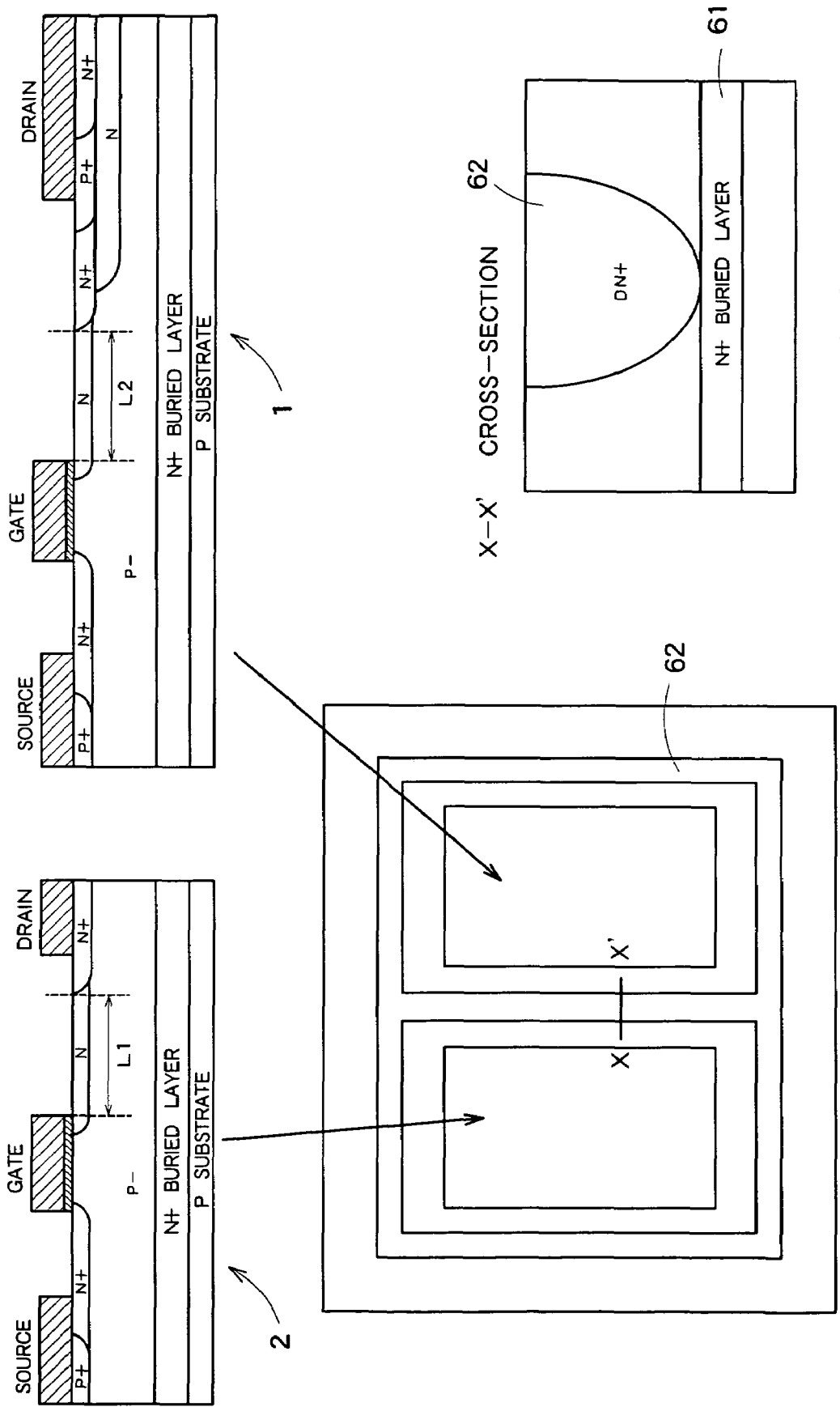
FIG. 15A is a view in which the LDMOS and the protective device are arranged adjacently.
FIG. 15B is a view showing an x-x' line sectional structure of FIG. 15A.

The protective device 1 operates so as to fill holes in the P⁻ active layer 8, when Electrostatic discharge occurs. As shown in FIG. 3, since the parasitic transistor Q3 is also present in LDMOS 2, it may be possible that the parasitic transistor Q3 of the protective device 1 turns on due to hole current. If the parasitic transistor Q3 in LDMOS 2 will be turned on, since there is no hole implantation from the drain side, current concentration may occur at the drain edge, resulting in destruction. Therefore, it is desirable to prevent the hole current from flowing into LDMOS 2 by arranging LDMOS 2 and the protective device 1 adjacent to each other as shown in FIG. 15A, and by surrounding the surroundings of the protective device 1 with an N⁺ buried layer 61 and a DN⁺ buried contact region 62 as shown in FIG. 15B. Here, FIG. 15B is the sectional view along the x-x' line of FIG. 15A.

Gates of LDMOS 2 and the protective device 1 may be connected mutually as shown in FIG. 16, or the gate and the source of the protective device 1 may be shorted as shown in FIG. 17. As for the circuit of FIG. 16, even during usual operation, the protective device 1 can be turned on to reduce the on-resistance of LDMOS 2, however, in some cases, this may cause an error operation such as that LDMOS 2 cannot be perfectly turned off. On the contrary, as for the circuit of FIG. 17, it can be used with the protective device 1 being always turned off, thereby, the on-resistance during ordinary operation becomes worse, but the error operation becomes hardly occur.

In the above mentioned embodiments, the conductivity types of each layer and region which form LDMOS 2 and the protective device 1 are not limited to the above mentioned ones. It is possible to change all the conductive types into reverse types, or, if necessary, it is possible to change the conductivity types of parts of layers and regions into reverse types. In this case, in the parasitic transistor or the vertical transistor Q1 formed in the semiconductor device, NPN transistor may also become PNP transistor, or vice versa.

What is claimed is:

1. A semiconductor device, comprising:
   a source region, a channel region and a drain region formed in order along a surface of a substrate;
   a vertical type bipolar transistor formed from the source region below the substrate;
   a base contact region of the vertical type bipolar transistor;
   a buried layer connected to the vertical type bipolar transistor;
   a buried contact layer disposed between the drain region and the buried layer, the buried contact layer having the same conductive type as that of the drain region; and
   a drift region formed between the drain region and the channel region, which has the same conductive type as that of the drain region and has impurity concentration less than that of the drain region.

2. The semiconductor device according to claim 1, further comprising:
   a first conductive type semiconductor region which is formed on the buried layer and constitutes a portion of the vertical bipolar transistor,
   wherein the source region, the drain region, the buried layer, the buried contact layer and the drift region are a first conductive type, and
   the channel region and the base contact region are a second conductive type.

3. The semiconductor device according to claim 1, further comprising:
   a high resistance region formed between the drift region and a drain electrode.

4. The semiconductor device according to claim 3,
   wherein the high resistance region is an impurity diffusion region formed between the drift region and the drain electrode.

5. A semiconductor device according to claim 1, further comprising:
   a gate electrode disposed on the channel region,
   wherein the source region is disposed on the surface of the substrate at a location departed from a location just below the gate electrode.

* * * * *